(12) United States Patent
Hu et al.

(10) Patent No.: US 11,435,703 B2
(45) Date of Patent: Sep. 6, 2022

(54) ELECTRONIC DEVICE AND WEARABLE DEVICE

(71) Applicant: GUANGDONG OPPO MOBILE TELECOMMUNICATIONS CORP., LTD., Guangdong (CN)

(72) Inventors: Jianghua Hu, Guangdong (CN); Yuege Xue, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/884,549

(22) Filed: May 27, 2020

(65) Prior Publication Data

US 2021/0011436 A1 Jan. 14, 2021

(30) Foreign Application Priority Data

Jul. 11, 2019 (CN) .......................... 201921088808.4

(51) Int. Cl.
  *G04G 17/08* (2006.01)
  *G04G 17/06* (2006.01)
  *H05K 5/00* (2006.01)
  *H05K 5/03* (2006.01)

(52) U.S. Cl.
  CPC ............. *G04G 17/08* (2013.01); *G04G 17/06* (2013.01); *H05K 5/0086* (2013.01); *H05K 5/03* (2013.01)

(58) Field of Classification Search
  CPC ....... G06F 1/1658; G06F 1/163; G04G 17/04; G04G 17/06; G04G 17/08; G04G 17/00; H05K 5/03; H05K 5/0086; H02J 7/0045; H01R 12/7011; H01R 12/70
  See application file for complete search history.

(56) References Cited

U.S. PATENT DOCUMENTS 8,620,395 B2 * 12/2013 Kang ..................... H04M 1/02
                                                      361/752
2011/0053666 A1   3/2011 Kang et al.
2016/0070339 A1 * 3/2016 Crawford ............... G06F 3/011
                                                      345/156

(Continued)

FOREIGN PATENT DOCUMENTS

CN        205318113 U     6/2016
CN        205353592 U     6/2016

(Continued)

OTHER PUBLICATIONS

Communication pursuant to Article 94(3) EPC for EP Application 20180872.2 dated Dec. 10, 2021. (12 pages).

(Continued)

*Primary Examiner* — Edwin A. Leon
(74) *Attorney, Agent, or Firm* — Young Basile Hanlon & MacFarlane, P.C.

(57) ABSTRACT

An electronic device and a wearable device are disclosed. The electronic device includes: a casing; a main board; and at least one fixing member fixing the main board to the casing, having a first end connected to the main board and a second end exposed from the casing, and configured to charge the electronic device or transmit data of the electronic device. The wearable device includes the electronic device and a strap connected to a middle frame of the electronic device.

19 Claims, 5 Drawing Sheets

(56) References Cited

U.S. PATENT DOCUMENTS

| | | | |
|---|---|---|---|
| 2016/0154425 A1 | 6/2016 | Yang et al. | |
| 2017/0011210 A1* | 1/2017 | Cheong | A61B 5/681 |
| 2018/0090890 A1* | 3/2018 | Kallman | H01R 13/745 |
| 2019/0165516 A1* | 5/2019 | Li | H02J 50/10 |

FOREIGN PATENT DOCUMENTS

| | | |
|---|---|---|
| CN | 205753500 U | 11/2016 |
| CN | 206441932 U | 8/2017 |
| CN | 208889918 U | 5/2019 |
| CN | 210156587 U | 3/2020 |
| WO | 2009089393 A1 | 7/2009 |
| WO | 2016197579 A1 | 12/2016 |

OTHER PUBLICATIONS

Indian Examination Report for IN Application 202014024928 dated Jul. 9, 2021. (5 pages).
ISR for PCT application PCT/CN2020/095586 dated Sep. 16, 2020.
OA for EP application 20180872.2 dated Nov. 16, 2020.

\* cited by examiner

ELECTRONIC DEVICE AND WEARABLE DEVICE

CROSS-REFERENCE TO RELATED APPLICATION(S)

This application claims priority to and the benefit of Chinese Patent Application No. 201921088808.4, filed on Jul. 11, 2019, the entire disclosure of which is hereby incorporated by reference.

TECHNICAL FIELD

The present disclosure relates to a technical field of electronic devices, more particular, to an electronic device and a wearable device with the electronic device.

BACKGROUND

Resilience exists between connector contacts of a resilient connector of a traditional electronic device and a main board thereof, and affected by the resilience, a casing is prone to falling off the electronic device.

SUMMARY

In a first aspect of the present disclosure, embodiments provide an electronic device. In a second aspect of the present disclosure, embodiments provide a wearable device.

An electronic device is provided and includes: a casing; a main board; and at least one fixing member fixing the main board to the casing, having a first end connected to the main board and a second end exposed from the casing, and configured to charge the electronic device or transmit data of the electronic device.

Another electronic device is provided and includes: a casing; a middle frame connected to the casing only by an adhesive layer and defining a receiving cavity with the casing; a main board received in the receiving cavity; and an electrical coupling assembly through which the electronic device is capable of being charged and transmitting data, the electrical coupling assembly comprising: at least one fixing member fixing the main board to the casing, and having a first end connected to the main board and a second end exposed from the casing; and at least one connector having a first end exposed from the casing and a second end electrically connected to the main board.

A wearable device is provided and includes an electronic device and a strap. The electronic device includes: a back cover; a middle frame connected to the back cover and defining a receiving cavity with the back cover; a main board received in the receiving cavity; and at least one fixing member fixing the main board to the back cover, having a first end connected to the main board and a second end passing through the back cover, and configured to charge the electronic device or transmit data of the electronic device. The strap is connected to the middle frame.

BRIEF DESCRIPTION OF DRAWINGS

In order to explain the technical solutions in embodiments of the present disclosure or in the related art more clearly, drawings used in the description of the embodiments or the related art will be briefly introduced below. Clearly, the drawings described below only illustrate some embodiments of the present disclosure. For those skilled in the art, other drawings can be obtained without paying creative efforts based on these drawings.

DETAILED DESCRIPTION

In order to facilitate understanding of the present disclosure, the present disclosure will be described in details with reference to the drawings. The drawings illustrate example embodiments of the present disclosure. However, the present disclosure can be implemented in many different forms and is not limited to the embodiments described herein. Rather, these embodiments are intended to provide a thorough and comprehensive understanding of the present disclosure.

The present disclosure relates to an electronic device including: a casing; a main board; and at least one fixing member fixing the main board to the casing, having a first end connected to the main board and a second end exposed from the casing, and configured to charge the electronic device or transmit data of the electronic device.

The present disclosure relates to another electronic including: a casing; a middle frame connected to the casing only by an adhesive layer and defining a receiving cavity with the casing; a main board received in the receiving cavity; and an electrical coupling assembly through which the electronic device is capable of being charged and transmitting data, the electrical coupling assembly comprising: at least one fixing member fixing the main board to the casing, and having a first end connected to the main board and a second end exposed from the casing; and at least one connector having a first end exposed from the casing and a second end electrically connected to the main board.

The present disclosure further relates to a wearable device including an electronic device and a strap. The electronic device includes: a back cover; a middle frame connected to the back cover and defining a receiving cavity with the back cover; a main board received in the receiving cavity; and at least one fixing member fixing the main board to the back cover, having a first end connected to the main board and a second end passing through the back cover, and configured to charge the electronic device or transmit data of the electronic device. The strap is connected to the middle frame.

Figure 1:
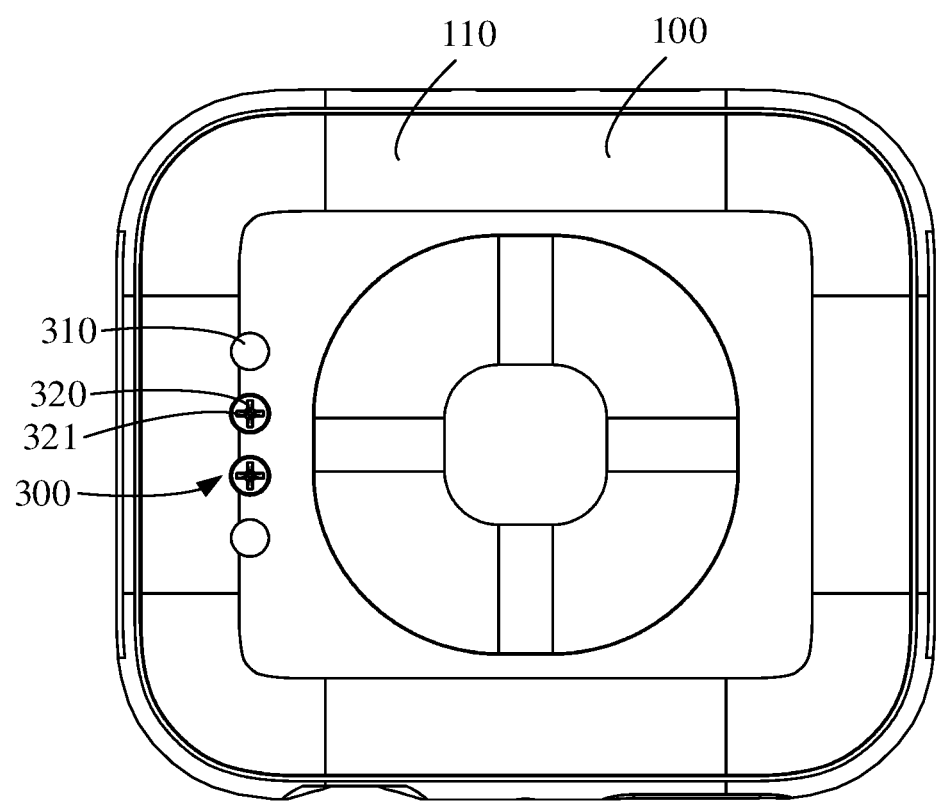
FIG. 1 illustrates a rear view of an electronic device provided by an embodiment.

FIG. 1 illustrates an electronic device 100, and the electronic device 100 can be a watch head of a watch, a mobile phone, a computer, a tablet, or the like. In the present disclosure, the electronic device 100 is illustrated as a watch head for example. The watch head includes a middle frame and a back cover that covers the middle frame. When a user wears a watch, the back cover is in contact with the user's skin. The electronic device 100 can be made of a non-metallic material, such as plastic, rubber, silicone, wood, or ceramic. The electronic device 100 can also be made of a metal material, such as stainless steel, aluminum alloy, or magnesium alloy. The electronic device 100 defines a receiving cavity therein. In some embodiments, the electronic device 100 is a smart electronic device, and the receiving cavity can be used to install electronic components such as a battery, a processor, a display screen, and a biosensor, but the display screen is not necessary and therefore can be omitted. The biosensor can be used to detect biological data such as heart rate, respiration rate, blood pressure, or body fat. In some embodiments, the biosensor can also be used to detect the movement state, such as for step counting.

Figure 2:
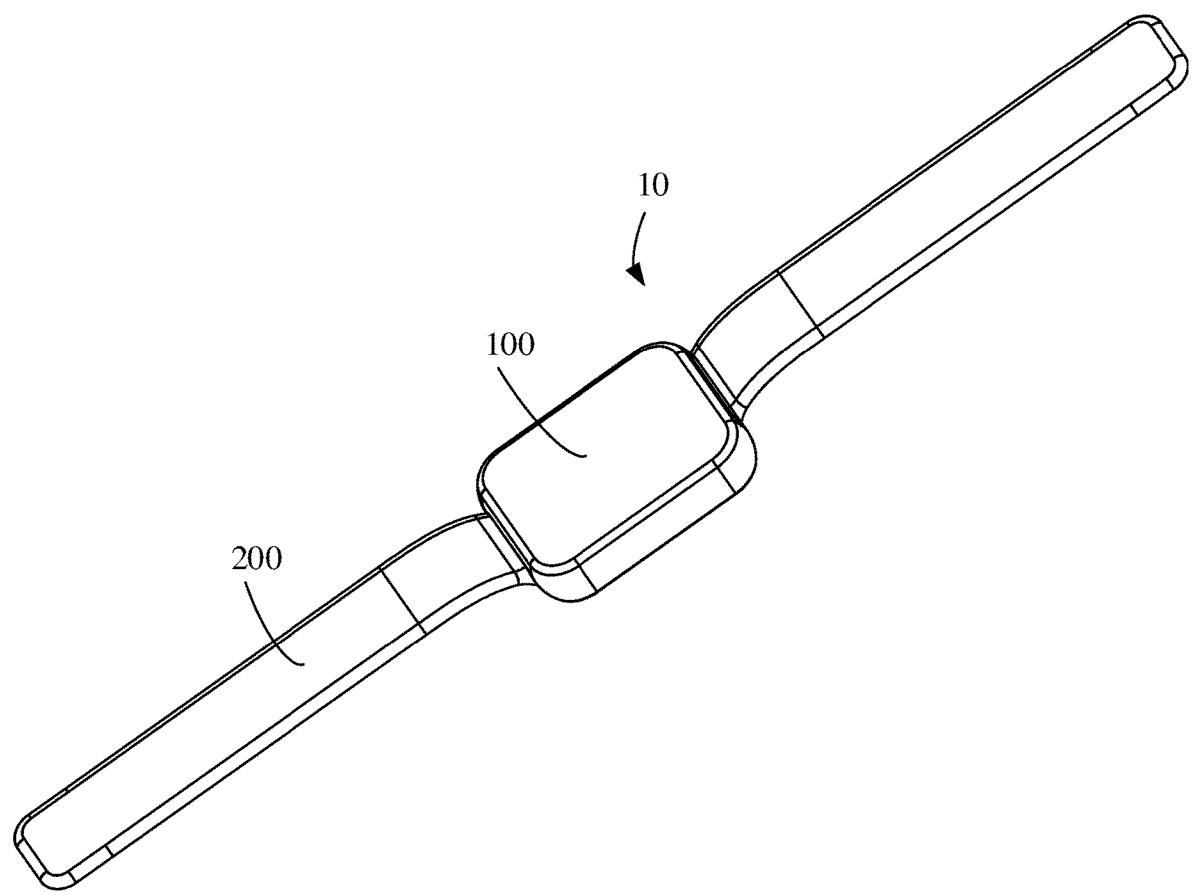
FIG. 2 illustrates a perspective view of a wearable device provided by an embodiment.
Figure 3:
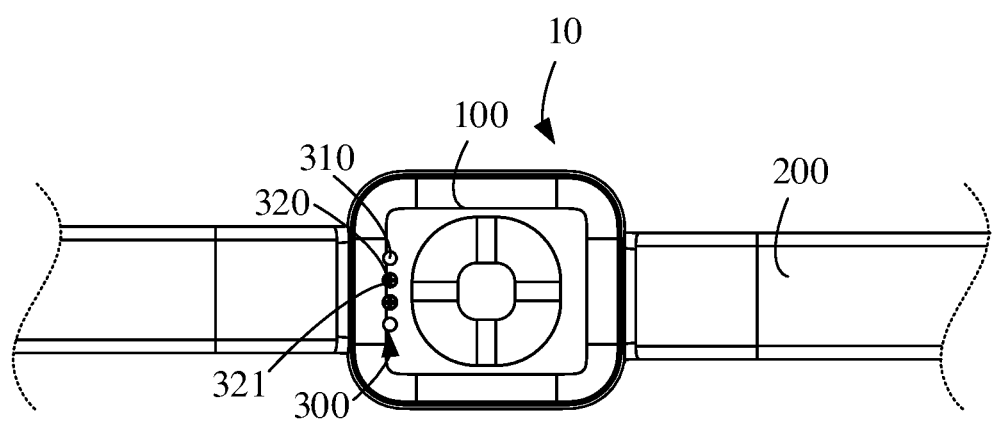
FIG. 3 illustrates a rear view of the wearable device in FIG. 2.

FIGS. 2-3 illustrate a wearable device 10. The wearable device 10 includes an electronic device 100 and a strap 200. The strap 200 is used to fix the electronic device 100 to the user's body, such as limbs or torso. It could be understood that the strap 200 can fix the electronic device 100 in any position desired by the user, which is not limited to the limbs or torso. In some embodiments, the wearable device 10 can be a sports wearable device or a conventional wearable device. A common form of the sports wearable device is an electronic watch, and a common form of the conventional wearable device is a mechanical watch. In some other embodiments, the wearable device 10 can also be a smart bracelet or the like.

In an embodiment, the electronic device 100 is provided with a mounting groove for mounting the strap 200. The strap 200 can be snapped to the electronic device 100 and can be detached from the electronic device 100. In another embodiment, the strap 200 can also be a non-removable structure. That is, after being fixed to electronic device 100, the strap 200 cannot be removed by the user unless it is subjected to professional disassembly, or violent disassembly, or discarded disassembly by maintenance agencies. In some embodiments, the strap 200 is divided into two sections: one end of each section of the strap 200 is connected to the electronic device 100, and the other end of each section of the strap 200 that is away from the electronic device 100 can be fastened to form a receiving space, such that the wearable device 10 can be worn on the wrist or an upper arm or other body parts of the user by means of the strap 200. In some other embodiments, the strap 200 can be of a one-piece structure: two ends of the strap 200 are both connected to the electronic device 100, and the strap 200 can be used to adjust the size of the receiving space by other structures, to allow the user to wear it conveniently. In an embodiment, the material of the strap 200 can be leather, plastic, silicone, rubber, metal, or the like.

In an embodiment, the wearable device 10 has a length direction, a width direction, and a thickness direction. The length direction of the strap 200, when it is flattened, is the length direction of the wearable device 10, the width direction of the strap 200 is the width direction of the wearable device 10, and the thickness direction of the strap 200 is the thickness direction of the wearable device 10.

Figure 4:
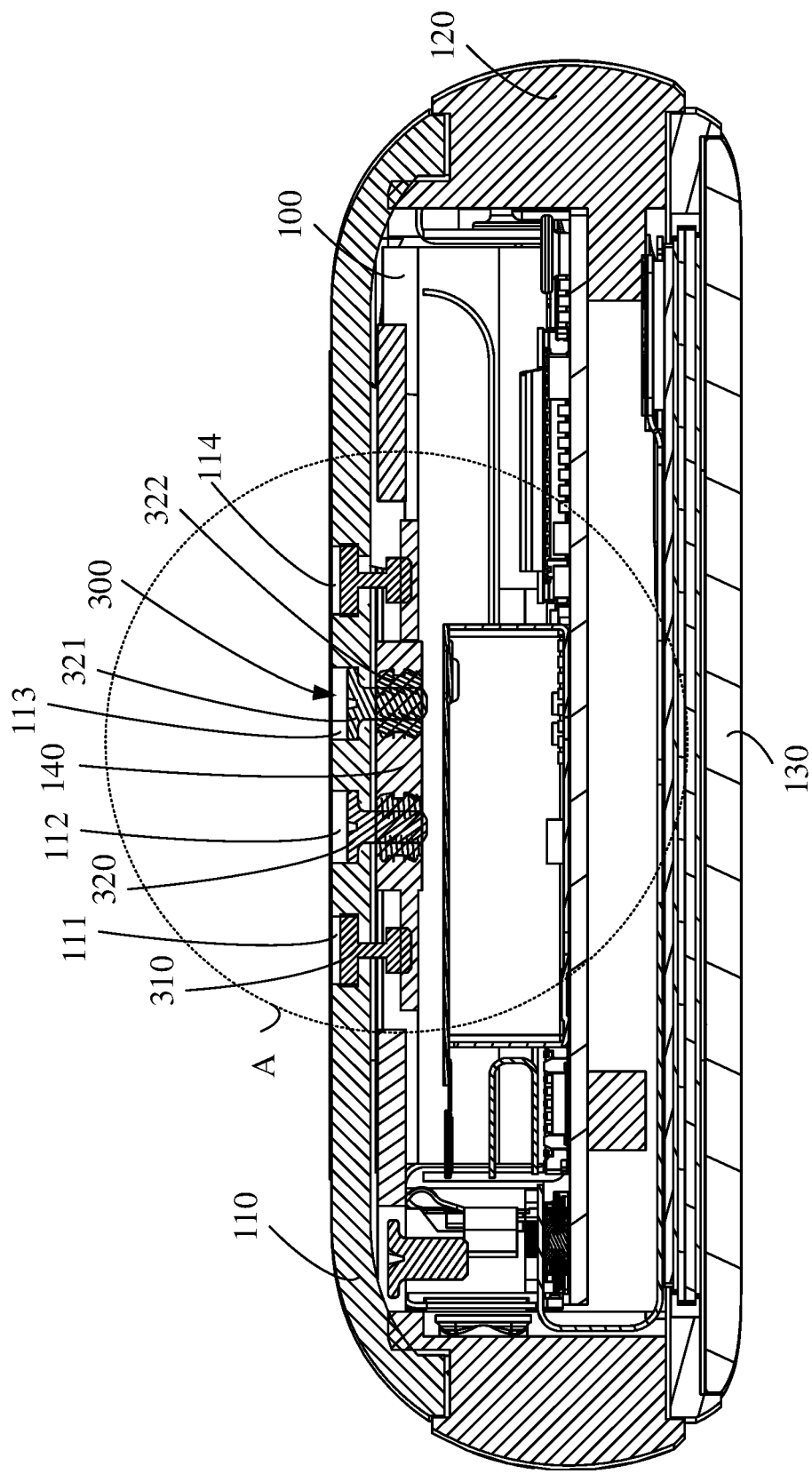
FIG. 4 illustrates a sectional view of the electronic device in FIG. 1.

As illustrated in FIGS. 1 and 4, in an embodiment, the electronic device 100 includes a casing 110, a main board 140, a middle frame 120, and a display screen 130. The casing 110 is the back cover of the watch head, and the middle frame 120 is the middle frame of the watch head. It could be understood that the display screen 130 can be an LED or OLED screen and can also be a time display element of the watch head, including a dial, hands, and the like. The middle frame 120, the casing 110, and the display screen 130 together form the external structure of the electronic device 100, and a space enclosed by the three is the receiving cavity of the electronic device 100. The main board 140 is located in the receiving cavity, and a processor is located on the main board 140.

Figure 5:
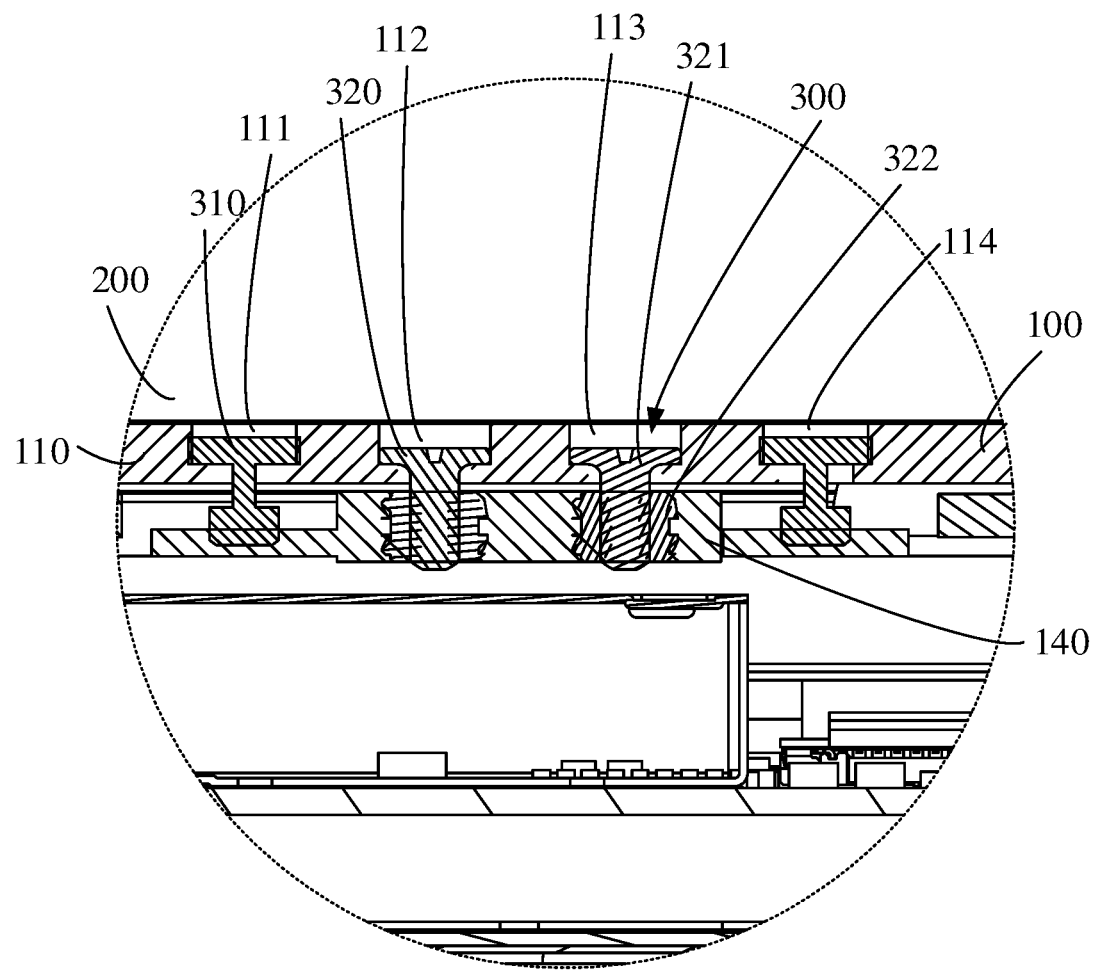
FIG. 5 illustrates an enlarged view of part A of the electronic device in FIG. 4.

As illustrated in FIGS. 1, 4 and 5, in an embodiment, the electronic device 100 includes an electrical coupling assembly 300. The electronic device 100 can be charged and transmit data through the electrical coupling assembly 300. The electrical coupling assembly 300 includes one or more fixing members 320. The fixing member 320 has a first end connected to the main board 140 and a second end passing through the casing 110 (the back cover) and exposed from the casing 110 (the back cover), such that the fixing member 320 can fix the main board 140 to the casing 110 (the back cover). The electronic device 100 can be charged through the fixing member 320 or can transmit data through the fixing member 320. It could be understood that the fixing member 320 capable of charging or transmitting data includes three situations: first, a single fixing member 320 has a charging function but cannot transmit data; second, a single fixing member 320 can transmit data but has no charging function; third, a single fixing member 320 has both a charging function and the ability to transmit data. When a single fixing member 320 has the charging function but cannot transmit data, another fixing member 320 capable of transmitting data can be provided at the same time, such that the electronic device 100 is charged through a part of the fixing members 320 and transmits data through another part of the fixing members 320. When a single fixing member 320 is capable of charging and transmitting data, the electronic device 100 can be provided with the single fixing member 320 to be charged and transmit data, or can be provided with a plurality of fixing members 320 to improve the efficiency of charging and transmitting data.

As illustrated in FIGS. 1, 4 and 5, the electrical coupling assembly 300 includes a connector 310 and at least one fixing member 320. The connector 310 and the fixing member 320 are spaced apart from each other and arranged in parallel. It could be understood that the connector 310 and the fixing member 320 are spaced apart from each other; that is, they do not interfere with each other, there is a space between the two, and the connector 310 and the fixing member 320 are parallel or approximately parallel. In an embodiment, the connector 310 is a pogo pin connector and used for charging or transmitting data. The fixing member 320 can restrain the main board 140 and the casing 110, such that the pogo pin connector is kept in abutment with the main board 140 under the restraint of the fixing member 320, thereby realizing electrical connection. The connector 310 passes through the casing 110 and is electrically connected to the main board 140, and an end of the connector 310 connected to the main board 140 can be retracted. When the connector 310 is connected to the main board 140, the end of the connector 310 connected to the main board 140 is in a compressed state, such that a resilient force exists between the connector 310 and the main board 140. The first end of the fixing member 320 is connected to the main board 140, and the second end thereof passes through the casing 110 and is exposed from the casing 110, such that the fixing member 320 can fix the main board 140 to the casing 110. The casing 110 and the middle frame 120 are fixed by an adhesive, and the adhesive forms an adhesive layer with a large width, such that it is waterproof and dustproof between the casing 110 and the middle frame 120, thereby effectively protecting the electronic components inside the electronic device 100 and prolonging the service life of the electronic components. The electronic device 100 can be charged or transmit data through the fixing member 320.

As illustrated in FIGS. 1, 4, and 5, in an embodiment, the fixing member 320 includes a first connecting member 321 and a second connecting member 322. The first connecting member 321 passes through the casing 110, and the second connecting member 322 is fixed to the main board 140. The first connecting member 321 and the second connecting member 322 cooperate to fix the main board 140 to the casing 110. In an embodiment, the first connecting member 321 is configured as a screw, and the second connecting member 322 is configured as a nut. In the thickness direction of the wearable device 10, the second connecting member 322 is embedded in the main board 140. The first connecting member 321 passes through the casing 110 and is fitted with the second connecting member 322 by threads, such that the main board 140 is fixed to an inner surface of the casing 110. In an embodiment, an outer surface of the first connecting member 321 is plated with gold or rhodium ruthenium to form a first plating (not shown), such that the first connecting member 321 has better electrically conductive performance. An outer surface of the second connecting member 322 is plated with gold or rhodium ruthenium to form a second plating (not shown), such that the second connecting member 322 has better electrically conductive performance. When the first connecting member 321 and the second connecting member 322 are fixed by threads, the first plating is in contact with the second plating. When the electronic device 100 is coupled with an external power supply by the fixing member 320, the external power supply can charge the electronic device 100 through the first connecting member 321 and the second connecting member 322; or when the electronic device 100 is coupled with an external device by the fixing member 320, data can be transmitted between the electronic device 100 and the external device through the first connecting member 321 and the second connecting member 322.

As illustrated in FIGS. 1, 4, and 5, in an embodiment, an adhesive layer is provided between an end surface of the casing 110 and the middle frame 120, and the adhesive layer fixedly connects the casing 110 to the middle frame 120. It could be understood that the adhesive layer fills a gap between the end surface of the casing 110 and the middle frame 120, and the adhesive layer has a large width, thereby achieving the sealing between the end surface of the casing 110 and the middle frame 120 and allowing the electronic device 100 to be waterproof and dustproof.

In an embodiment, the electrical coupling assembly 300 includes two connectors 310 and two fixing members 320. The casing 110 is provided with a first through hole 111, a second through hole 112, a third through hole 113, and a fourth through hole 114. One connector 310 passes through the first through hole 111, the other connector 310 passes through the fourth through hole 114, and the two fixing members 320 pass through the second through hole 112 and the third through hole 113 respectively. Each connector 310 has a first end exposed from the casing 110 and a second end electrically connected to the main board 140, and a resilient force exists between each connector and the main board 140. Each fixing member 320 has a first end exposed from the casing 110 and a second end fixedly connected to the main board 140, and fixes the main board 140 to the casing 110, and at the same time, the resilient force between the connector 310 and the main board 140 is counteracted. In another embodiment, the electrical coupling assembly 300 includes M connectors 310 and N fixing members 320, wherein M is greater than or equal to 1 and N is greater than or equal to 1. The M connector(s) 310 and the N fixing member(s) 320 pass through the casing 110 and are electrically connected to the main board 140 and exposed from the casing 110. The electronic device 100 is charged through the connector(s) 310 and transmits data through the fixing member(s) 320; or the electronic device 100 transmits data through the connector(s) 310 and is charged through the fixing member(s) 320; or the electronic device 100 is charged through a part of the connectors 310 and a part of the fixing members 320 and transmits data through another part of the connectors 310 and another part of the fixing members 320; or the connector(s) 310 can be used for charging and data transmission, and the fixed member(s) 320 can be used for charging and data transmission. All the possibilities will not be exhausted herein. In yet another embodiment, the electrical coupling assembly 300 is composed of fixing members 320, and the number of the fixing members 320 is greater than or equal to one. The electronic device 100 transmits data through a part of the fixing members 320 and is charged through another part of the fixing members 320, or each fixing member 320 can be used for charging and data transmission, which will not be specifically limited herein.

In a traditional electronic device 100, a main board 140 is fixed to a middle frame 120; a casing 110 is bonded to the middle frame 120; a connector 310 passes through the casing 110 and is electrically connected to the main board 140; and the casing 110 and the middle frame 120 are further fixed by screws to prevent a resilient force between the connector 310 and the main board 140 from debonding the casing 110 from the middle frame 120.

The present disclosure utilizes the fixing member 320 capable of being energized to achieve the effects of fixing and energizing, and hence eliminates the need to separately provide independent holes for connection and fixation, thereby reducing the openings in the casing 110 and the weight of the electronic device. In the present disclosure, the main board 140 is fixed to the inner surface of the casing 110 by at least one fixing member 320 that can be used for charging and data transmission, such that there is no connection between the main board 140 and the middle frame 120. The resilient force between the connector 310 and the main board 140 is counteracted by the fixing member 320, and the main board 140 is fixed to the casing 110 instead of the middle frame 120, so the adhesion and fixation between the casing 110 and the middle frame 120 will not be affected in any way, and the casing 110 can be prevented from falling off the middle frame 120. The casing 110 and the middle frame 120 can be secured by using an adhesive and nothing else, so there is no need to use screws for fixation. For example, the present disclosure only needs the electrical coupling assembly 300, and the total number of the connectors 310 and the fixing members 320 is four, two of which are capable of charging and the remaining two are capable of transmitting data. The casing 110 just needs four openings, thereby reducing the number of openings and the manufacturing cost of the casing 110, and beautifying the overall appearance of the electronic device 100. The fixing member 320 has a variety of functions, including charging, data transmission, and fixing the main board 140 and the casing 110, such that screws are omitted, and the overall weight of the electronic device 100 is reduced. Therefore, by providing the fixing member 320 with the ability to charge or transmit data and the ability to fix the main board 140 and the casing 110, the number of openings in the casing 110 is reduced, the overall appearance of the electronic device 100 is beautified, and the total weight of the electronic device 100 is reduced, without affecting the charging and data transmission of the electronic device 100 and the strength fixing the casing 110 and the middle frame 120.

Embodiments of the Present Disclosure

The disclosure relates to an electronic device including: a casing; and a main board fixed to the casing by one or more fixing members, in which the fixing member has a first end connected to the main board and a second end exposed from the casing, the electronic device is capable of being charged through the one or more fixing members or transmitting data through the one or more fixing members, and in a case where there is one fixing member, the electronic device is capable of being charged or transmitting data through the fixing member.

In an embodiment, the fixing member comprises a first connecting member and a second connecting member, the first connecting member passes through the casing, the second connecting member is fixed to the main board, and the first connecting member cooperates with the second connecting member to fix the main board to the casing.

In an embodiment, the first connecting member is configured as a screw, and the second connecting member is configured as a nut.

In an embodiment, the first connecting member includes a first plating, the second connecting member includes a second plating, and when the first connecting member is fitted with the second connecting member, the first plating is in contact with the second plating, to enable the fixing member to conduct electricity.

In an embodiment, a material of the first plating is gold or rhodium ruthenium, and a material of the second plating is gold or rhodium ruthenium.

In an embodiment, the electronic device includes a connector spaced from and parallel with the fixing member. The connector passes through the casing, and the connector has a first end exposed from the casing and a second end electrically connected to the main board.

In an embodiment, the connector is configured as a pogo pin connector.

In an embodiment, the electronic device includes a middle frame, and an adhesive layer is provided between the casing and the middle frame and fixedly connects the casing with the middle frame.

In an embodiment, the electronic device is a watch head of a watch, the watch head includes the middle frame and a back cover, the back cover is fixed to the middle frame, and the casing is the back cover.

The disclosure further relates to a wearable device including: the above electronic device, including a middle frame; and a strap connected to the middle frame and configured to secure the electronic device to a user's body.

The disclosure further relates to an electronic device including: a casing; a main board; and an electrical coupling assembly through which the electronic device is capable of being charged or transmitting data. The electrical coupling assembly includes at least one fixing member, and the fixing member fixes the main board to the casing.

In an embodiment, the fixing member includes a first connecting member and a second connecting member, the first connecting member passes through the casing, the second connecting member is fixed to the main board, and the first connecting member cooperates with the second connecting member to fix the main board to the casing.

In an embodiment, the first connecting member is configured as a screw provided with a first plating, the second connecting member is configured as a nut provided with a second plating, and when the first connecting member is fitted with the second connecting member, the first plating is in contact with the second plating, to enable the fixing member to conduct electricity.

In an embodiment, a material of the first plating is gold or rhodium ruthenium, and a material of the second plating is gold or rhodium ruthenium.

In an embodiment, the electrical coupling assembly includes a connector, the connector passes through the casing, and has a first end exposed from the casing and a second end electrically connected to the main board.

In an embodiment, the connector is configured as a pogo pin connector.

In an embodiment, the electronic device includes a middle frame, and an adhesive layer is provided between the casing and the middle frame and fixedly connects the casing with the middle frame.

The disclosure further relates to an electronic device including: a casing; a middle frame connected to the casing to define a receiving cavity; a main board fixed to the casing through at least one fixing member and located in the receiving cavity; and a pogo pin connector passing through the casing, spaced apart from the fixing member, and having a first end exposed from the casing and a second end, the second end being in elastic contact with the main board and electrically connected to the main board.

In an embodiment, the fixing member has a first end connected to the main board and a second end exposed from the casing, and the electronic device is capable of being charged or transmitting data through the fixing member.

In an embodiment, the fixing member includes a first connecting member and a second connecting member, the first connecting member passes through the casing, the second connecting member is fixed to the main board, and the first connecting member cooperates with the second connecting member to fix the main board to the casing.

In an embodiment, the first connecting member is configured as a screw provided with a first plating, the second connecting member is configured as a nut provided with a second plating, and when the first connecting member is fitted with the second connecting member, the first plating is in contact with the second plating, to enable the fixing member to conduct electricity.

The technical features of the embodiments described above can be freely combined. In order to simplify the description, not all possible combinations of the technical features in the above embodiments have been described. However, as long as there is no contradiction in the combinations of these technical features, the combinations should be considered to fall into the scope of the present disclosure.

The above embodiments only indicate several implementations of the present disclosure, and their descriptions are relatively specific and detailed, but they cannot be understood as limitations on the scope of the present disclosure. It should be noted that, for those skilled in the art, modifications and improvements can be made without departing from the concept of the present disclosure, and they all belong to the protection scope of the present disclosure. Therefore, the protection scope of the present disclosure shall be subject to the appended claims.

What is claimed is:

1. An electronic device, comprising:
   a casing;
   a main board; and
   at least one fixing member fixing the main board to the casing, having a first end connected to the main board and a second end exposed from the casing, and configured to charge the electronic device or transmit data of the electronic device,
   wherein the at least one fixing member comprises a first connecting member and a second connecting member, the first connecting member passes through the casing, the second connecting member is fixed to and embedded in the main board, and the first connecting member cooperates with the second connecting member to fix the main board to the casing.

2. The electronic device according to claim 1, wherein the first connecting member is configured as a screw, and the second connecting member is configured as a nut.

3. The electronic device according to claim 1, wherein the first connecting member comprises a first plating, the second connecting member comprises a second plating, and when the first connecting member is fitted with the second connecting member, the first plating is in contact with the second plating to enable the at least one fixing member to conduct electricity.

4. The electronic device according to claim 3, wherein a material of the first plating is gold or rhodium ruthenium, and a material of the second plating is gold or rhodium ruthenium.

5. The electronic device according to claim 1, comprising a connector spaced from and parallel with the at least one fixing member, wherein the connector passes through the casing, and has a first end exposed from the casing and a second end electrically connected to the main board.

6. The electronic device according to claim 5, wherein the connector is configured as a pogo pin connector.

7. The electronic device according to claim 1, comprising a middle frame, wherein an adhesive layer is provided between the casing and the middle frame and fixedly connects the casing with the middle frame.

8. The electronic device according to claim 7, wherein the electronic device is a watch head of a watch, the watch head comprises the middle frame and a back cover, the back cover is fixed to the middle frame, and the casing is the back cover.

9. An electronic device, comprising:
a casing;
a middle frame connected to the casing by an adhesive layer and defining a receiving cavity with the casing;
a main board received in the receiving cavity; and
an electrical coupling assembly through which the electronic device is capable of being charged and transmitting data, the electrical coupling assembly comprising:
at least one fixing member fixing the main board to the casing, and having a first end connected to the main board and a second end exposed from the casing; and
at least one connector having a first end exposed from the casing and a second end electrically connected to the main board,
wherein the at least one fixing member comprises a first connecting member and a second connecting member, the first connecting member passes through the casing, the second connecting member is fixed to and embedded in the main board, and the first connecting member cooperates with the second connecting member to fix the main board to the casing.

10. The electronic device according to claim 9, wherein the connector is configured as a pogo pin connector.

11. The electronic device according to claim 9, wherein the middle frame and the casing form a part of an external structure of the electronic device.

12. The electronic device according to claim 9, wherein the at least one fixing member is configured to transmit data of the electronic device, and the at least one connector is configured to charge the electronic device.

13. The electronic device according to claim 12, wherein the first connecting member is configured as a screw provided with a first plating, the second connecting member is configured as a nut provided with a second plating, and when the first connecting member is fitted with the second connecting member, the first plating is in contact with the second plating to enable the at least one fixing member to conduct electricity.

14. The electronic device according to claim 13, wherein a material of the first plating is gold or rhodium ruthenium, and a material of the second plating is gold or rhodium ruthenium.

15. A wearable device, comprising:
an electronic device, comprising:
a back cover;
a middle frame connected to the back cover and defining a receiving cavity with the back cover;
a main board received in the receiving cavity; and
at least one fixing member fixing the main board to the back cover, having a first end connected to the main board and a second end passing through the back cover, and configured to charge the electronic device or transmit data of the electronic device; and
a strap connected to the middle frame,
wherein the at least one fixing member comprises a first connecting member and a second connecting member, the first connecting member passes the back cover, the second connecting member is fixed to and embedded in the main board, and the first connecting member cooperates with the second connecting member to fix the main board to the back cover.

16. The wearable device according to claim 15, comprising a pogo pin connector passing through the back cover, spaced apart from the at least one fixing member, and having a first end exposed from the back cover and a second end, the second end being in elastic contact with the main board and electrically connected to the main board.

17. The wearable device according to claim 15, wherein the first connecting member is configured as a screw provided with a first plating, the second connecting member is configured as a nut provided with a second plating, and when the first connecting member is fitted with the second connecting member, the first plating is in contact with the second plating, to enable the at least one fixing member to conduct electricity.

18. The electronic device according to claim 5, wherein the second end of the connector is in elastic contact with the main board.

19. The electronic device according to claim 9, wherein the second end of the connector is in elastic contact with the main board.

* * * * *